United States Patent [19]
Koura

[11] Patent Number: 5,835,426
[45] Date of Patent: Nov. 10, 1998

[54] REDUNDANT CIRCUIT

[75] Inventor: Masato Koura, Tokyo, Japan

[73] Assignee: Mitsubishi Denki Kabushiki Kaisha, Tokyo, Japan

[21] Appl. No.: 968,068

[22] Filed: Nov. 12, 1997

[30] Foreign Application Priority Data

Jun. 26, 1997 [JP] Japan .................................. 9-170770

[51] Int. Cl.$^6$ ................................................ G11C 29/00
[52] U.S. Cl. ...................................... 365/200; 365/185.09
[58] Field of Search ............................. 365/200, 185.09, 365/185.18, 185.05, 230.06

[56] References Cited

U.S. PATENT DOCUMENTS

| | | | |
|---|---|---|---|
| 4,382,249 | 5/1983 | Jacobsthal | 340/347 |
| 5,018,104 | 5/1991 | Urai | 365/200 |
| 5,233,566 | 8/1993 | Imamiya et al. | 365/200 X |
| 5,300,840 | 4/1994 | Drouot | 365/200 X |
| 5,481,498 | 1/1996 | Han | 365/185.09 |

FOREIGN PATENT DOCUMENTS 778492  3/1995  Japan .

*Primary Examiner*—Son Mai
*Attorney, Agent, or Firm*—Leydig, Voit & Mayer

[57] ABSTRACT

The present invention includes a redundant circuit for addressing redundant memory cells. The redundant circuit solves a problem of a conventional redundant circuit caused by injection of electrons into and leakage of electrons from a floating gate of a non-volatile memory cells provided for respective bits of the addressing circuit of the redundant circuit. The redundant circuit has a timer that counts an elapsed time from power-on of the redundant circuit. The timer produces a timing signal when a fixed duration time period has elapsed. A breaker breaks the application of a supply voltage to the gate of a non-volatile memory cell in response to the timing signal.

19 Claims, 6 Drawing Sheets

REDUNDANT CIRCUIT

BACKGROUND OF THE INVENTION

1. Field of the Invention

The present invention relates to a redundant circuit, and particularly to a redundant circuit using a nonvolatile memory.

2. Description of Related Art

First, a redundant circuit of a memory such as a nonvolatile memory, will be explained briefly. The redundant circuit comprises memory cells (called redundant memory cells below) other than ordinary memory cells, and a circuit (called addressing circuit) for determining an address of the redundant memory cells. The redundant memory cells replace faulty ordinary memory cells of the nonvolatile memory, which are found in a test process. Recording the addresses of the faulty memory cells, the addressing circuit points to the redundant memory cells instead of the addressed faulty memory cells in the operation of the nonvolatile memory.

One of conventional redundant circuits employs as its addressing circuit resistors functioning as a fuse. FIG. 10 is a circuit diagram showing a part of the addressing circuit of the conventional redundant circuit using a resistor as a fuse, in which a circuit portion corresponding to only one bit is shown.

In FIG. 10, the reference numeral 1 designates a power supply terminal to which a supply voltage is applied; 2 designates a capacitor with its first electrode connected to the power supply terminal 1; 3 designates a resistor with its first end connected to the second electrode of the capacitor 2 at a connection point 7, and its second end connected to a ground 5; 4 designates a latch circuit with its input terminal connected to the connection point 7. The latch circuit 4 comprises inverters 41 and 42 connected in anti-parallel, and an inverter 43 connected in series with the inverter 41.

Next, the addressing operation of the addressing circuit will be described.

First, the addressing circuit has the resistor 3 remain at this place when storing L (low) level address data in the circuit portion of FIG. 10. In this case, since the connection point 7 is connected to ground through the resistor 3, its potential is maintained at the L level in spite of the supply voltage applied to the power supply terminal 1, and the potential of the L level is held by the latch circuit 4.

On the other hand, when storing H (high) level address data in the circuit portion, the resistor 3 is cut off by a laser beam. In this case, when the supply voltage is applied to the power supply terminal 1, the potential at the connection point 7 exceeds a threshold voltage of the inverter 41, and hence the latch circuit 4 latches the H level potential at the connection point 7.

The addressing circuit comprises circuit portions as shown in FIG. 10 by the number of bits constituting the addresses of the memory in which the redundant circuit is mounted, and carries out addressing by cutting off the resistor 3 with a laser beam for a bit of the H level addressing, and by retaining the resistor 3 for a bit of the L level addressing.

Using the addressing circuit as shown in FIG. 10 requires a laser beam generator, which may be expensive. For this reason, there is an addressing circuit obviating the need for the laser beam generator by employing a nonvolatile memory instead of the resistor 3. FIG. 11 is a circuit diagram showing one bit of such an addressing circuit utilizing the nonvolatile memory, in which like portions are designated by the same reference numerals as in FIG. 10, and the description thereof is omitted here.

In FIG. 11, the reference numeral 1' designates a power supply terminal to which a supply voltage is applied, and 8 designates a nonvolatile memory using an N-channel transistor. The reference numeral 9 designates the gate of the nonvolatile memory 8, which is connected to the power supply terminal 1'. The reference numeral 10 designates the drain of the nonvolatile memory 8, which is connected to the connection point 7. The reference numeral 11 designates the source of the nonvolatile memory 8, which is connected to the ground 5. The reference numeral 12 designates the floating gate of the nonvolatile memory 8, which is used to determine the H level or L level addressing depending on whether charges are injected to the floating gate 12.

Next, the addressing method of the addressing circuit will be described.

First, in the case where the nonvolatile memory 8 is not written, with its floating gate 12 not injected with electrons, a current flows from the drain 10 to the source 11 when the nonvolatile memory 8 is turned on by placing the gate 9 at the H level by applying the supply voltage from the power supply terminal 1' to the gate 9. In this state, since the potential at the connection point 7 is below the level to be recognized by the latch circuit 4 as the H level input, the output of the latch circuit 4 is held at the L level.

Next, in the case where the nonvolatile memory 8 is written, with its floating gate 12 injected with the electrons, no current flows from the drain 10 to the source 11 even if the gate 9 is raised to the supply voltage level. In this state, since the potential at the connection point 7 is beyond the level to be recognized by the latch circuit 4 as the H level input, the output of the latch circuit 4 is held at the H level.

Thus, the addressing can be achieved using the nonvolatile memory 8 by writing a bit for the H level addressing, and by not writing a bit for the L level addressing. Incidentally, although the gate 9 of the nonvolatile memory 8 is connected to the power supply terminal 1' in FIG. 11, this shows the state in which addressing is carried out with the nonvolatile memory 8. When writing and erasing the nonvolatile memory 8, the gate 9 is supplied with a gate input voltage required for accomplishing writing and erasing of the gate.

With such an arrangement, the conventional redundant circuit has a problem of reliability of data retention by the nonvolatile memory 8 constituting the addressing circuit. More specifically, although the floating gate 12 of the nonvolatile memory 8 is in the erased state free from the electron charge when the nonvolatile memory 8 is not written, if electrons happen to be injected into the floating gate 12 by some cause, the nonvolatile memory 8 changes to the written state. On the contrary, when writing the nonvolatile memory 8, if the electrons which have been stored in the floating gate 12 of the nonvolatile memory 8 are emitted therefrom, the nonvolatile memory 8 becomes the erased state.

In the nonvolatile memory 8, the electrons in the drain 10 or source 11 are subjected to an electrical force attracting them toward the floating gate 12, which is produced by applying the H level voltage to the gate 9. Normally, the H level voltage applied to the gate 9 does not lead the electrons to be stored in the floating gate 12 owing to the electrical force. However, depending on the fabricated condition of the nonvolatile memory 8, there is still some probability that the electrons will be injected into the floating gate 12 by applying the H level voltage to the gate 9. This does nit create a problem even if the electrons are injected to the floating gate 12 when it has already been charged with the electrons. However, when the nonvolatile memory 8 has not been written, the floating gate 12 is not charged with the electrons, and hence if it happens to be injected with the electrons, the state of the nonvolatile memory 8 changes from the erased state to the written state. This means that the bit of the addressing circuit pointing the address L wrongly points to the address H, which presents a problem (called problem 1 from now on).

In addition, while writing into the nonvolatile memory 8, if the supply voltage is applied to the power supply terminal 1, the H level voltage is applied to the drain 10 of the nonvolatile memory 8. In this case, the electrons stored in the floating gate 12 are subjected to an electrical force attracting them toward the drain 10. Normally, the H level voltage applied to the drain 10 does not lead the electrons to be discharged from the floating gate 12. However, depending on the fabricated condition of the nonvolatile memory 8, there is still some probability that the electrons are discharged from the floating gate 12 by the H level voltage applied to the drain 10. When the nonvolatile memory 8 has not been written, and hence the floating gate 12 is not charged with the electrons, there is no possibility that the electrons are discharged from the floating gate 12. However, when the nonvolatile memory 8 has been written, and if the electrons stored in the floating gate 12 happen to be discharged from the floating gate 12, the state of the nonvolatile memory 8 changes from the written state to the erased state. This means that the bit of the addressing circuit pointing the address H wrongly points the address L, which presents another problem (called problem 2 from now on).

Furthermore, the nonvolatile memory 8 has another problem in that the electrons stored in the floating gate 12 by the write operation of the nonvolatile memory 8 are subjected to natural discharge due to defects during the process of fabricating the nonvolatile memory 8. This causes the same condition as the problem 2: The bit of the addressing circuit pointing the address H wrongly points the address L, which presents still another problem (called problem 3 from now on).

SUMMARY OF THE INVENTION

The present invention is implemented to solve the foregoing problems. It is therefore an object of the- present invention to provide a redundant circuit which can prevent undesired electrons from charging in the floating gate 12 by applying an H level signal to the gate 9, thereby solving the problem 1.

Another object of the present invention is to provide a redundant circuit which can prevent the electrons stored in the floating gate 12 from being discharged by applying an H level signal to the drain 10, thereby solving the problem 2.

Still another object of the present invention is to provide a redundant circuit which can prevent the natural discharge of the electrons from the floating gate 12, thus solving the problem 3.

According to a first aspect of the present invention, there is provided a redundant circuit comprising: redundant memory cells; an addressing circuit for generating an addressing signal addressing an address of the redundant memory cells in accordance with the presence or absence of writing of a nonvolatile memory provided for each bit of the addressing signal, the nonvolatile memory having a gate, a drain and a source; timer means for counting a time period from a power on of the redundant circuit, and for outputting a timing signal when it counts a predetermined time period; and breaker means for breaking at least one of supply voltages to the gate and the drain of the nonvolatile memory in response to the timing signal.

Here, the redundant circuit may further comprise holding means for holding a voltage level of the drain of the nonvolatile memory.

The predetermined time period may be set longer than a time in which the holding means stabilizes its output, and the breaker means may have the gate of the nonvolatile memory disconnect from its supply voltage and connect to a ground in response to the timing signal.

The predetermined time period may be set longer than a time in which the holding means stabilizes its output, and the breaker means may have the drain of the nonvolatile memory disconnect from its supply voltage and place in a floating state in response to the timing signal.

The predetermined time period may be set longer than a time in which the holding means stabilizes its output, and the breaker means may comprise grounding means for grounding the drain of the nonvolatile memory in response to the timing signal, and disconnecting means for disconnecting the holding means from the drain in response to the timing signal.

The timer means may comprise a timer.

The timer means may comprise a CR delay circuit.

The breaker means may consist of MOSFETs.

The breaker means may consist of transmission gates.

The grounding means and the disconnecting means may each consist of an MOSFET.

The grounding means and the disconnecting means may each consist of a transmission gate.

According to a second aspect of the present invention, there is provided a redundant circuit comprising: redundant memory cells; an addressing circuit for generating an addressing signal addressing an address of the redundant memory cells in accordance with the presence or absence of writing of a nonvolatile memory provided for each bit of the addressing signal, the nonvolatile memory having a gate, a drain and a source; counting means for counting a number of power-on operations of the redundant circuit, and for outputting a counted signal when it counts a predetermined number of times of the power-on operations; and a write command signal output means for outputting a signal commanding writing into the nonvolatile memory in response to the counted signal.

Here, the redundant circuit may further comprise holding means for holding a voltage level of the drain of the nonvolatile memory, wherein the predetermined number of times of the power-on operations may be set at a number corresponding to a time in which the holding means can recognize a write state of the nonvolatile memory.

DETAILED DESCRIPTION OF THE PREFERRED EMBODIMENTS

The invention will now be described with reference to the accompanying drawings.

EMBODIMENT 1

Figure 1:
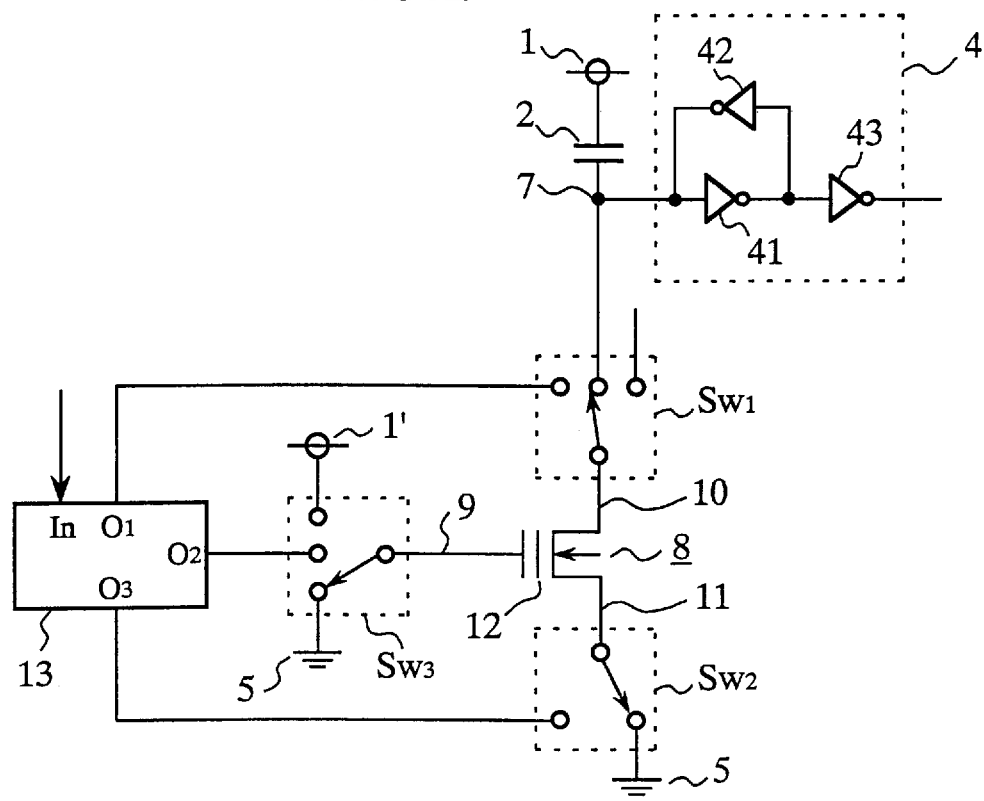
FIG. 1 is a circuit diagram showing part of the addressing circuit of an embodiment 1 of a redundant circuit in accordance with the present invention.

FIG. 1 is a circuit diagram showing part of an embodiment 1 of the addressing circuit of a redundant circuit in accordance with the present invention. This figure shows only a portion corresponding to one bit of the addressing circuit, and the same portion is provided for each bit of the redundant circuit.

In FIG. 1, the reference numerals 1 and 1' each designates a power supply terminal; 2 designates a capacitor with its first electrode connected to the power supply terminal 1; 4 designates a latch circuit (holding circuit) with its input terminal connected to a second electrode of the capacitor 2. The latch circuit 4 includes inverters 41 and 42 connected in anti-parallel, and an inverter 43 connected in series with the inverter 41.

The reference numeral 5 designates a ground; 7 designates a connection point of the capacitor 2 and the latch circuit 4; and 8 designates an nonvolatile memory 8 composed of an N-channel transistor having a gate 9, a drain 10, a source 11 and a floating gate 12. Injection or non-injection of charges into the gate 12 designates an H (high) level or an L (low) level of the addressing, respectively.

The reference numeral 13 designates a voltage converter with its input terminal In connected to a high voltage generator not shown in this figure and supplied with a high voltage therefrom. The voltage converter 13 outputs DC voltages of 7 V, 12 V and 10 V, for example, from its output terminals $O_1$, $O_2$ and $O_3$, respectively, in the case where the supply voltage is 5 V. The reference symbol $Sw_1$ designates a three-contact switch with its -first contact connected to the output terminal $O_1$ of the voltage converter 13, second contact connected to the connection point 7, third contact connected to nowhere, and its common contact connected to the drain 10 of the nonvolatile memory 8. The reference symbol $Sw_2$ designates a two-contact switch with its first contact connected to the output terminal $O_3$ of the voltage converter 13, second contact connected to the ground 5, and its common contact connected to the source 11 of the nonvolatile memory 8. The reference symbol $Sw_3$ designates a three-contact switch (first breaker means) with its first contact connected to the power supply terminal 1', second contact connected to the output terminal $O_2$ of the voltage converter 13, third contact connected to the ground 5, and its common contact connected to the gate 9 of the nonvolatile memory 8. These switches $Sw_1$–$Sw_3$ each consist of a semiconductor switch composed of transistors, for example, and are switched by control signals fed from a switch controller as shown in FIG. 2.

Figure 2:
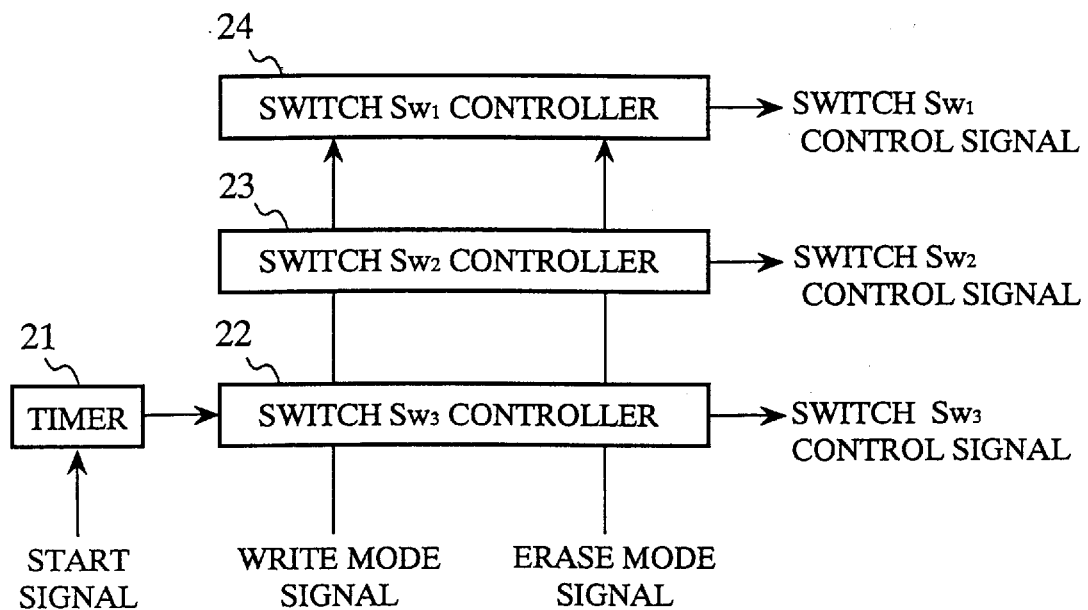
FIG. 2 is a block diagram showing a switch control circuit of the embodiment 1 of the redundant circuit in accordance with the present invention.

FIG. 2 is a block diagram showing a configuration of the switch controller for generating the switch control signals of the embodiment 1 shown in FIG. 1. In FIG. 2, the reference numeral 21 designates a timer (timer means) which maintains the H level output for a predetermined time period after the power is turned on, and then outputs a switching command signal instructing the transfer of the switch $Sw_3$ by changing its output level to the L level after the predetermined time has elapsed. The reference numeral 22 designates a switch $SW_3$ controller (first breaker means) for producing a switch $Sw_3$ control signal for transferring the switch $Sw_3$ in response to the switching command signal from the timer 21 and a write mode signal and an erase mode signal which are fed from a controller not shown in this figure and instruct write operation and erase operation of the nonvolatile memory 8, respectively. The reference numeral 23 designates a switch $Sw_2$ controller for producing a switch $Sw_2$ control signal for transferring the switch $Sw_2$ in response to the write mode signal and erase node signal, and 24 designates a switch $Sw_1$ controller for producing a switch $Sw_1$ control signal for transferring the switch $Sw_1$ in response to the write mode signal and erase node signal.

Next, the addressing operation of the embodiment 1 of the addressing circuit will be described.

First, a case will be described where the address data of the H level is to be stored in the circuit portion as shown in FIG. 1 by the write operation to the nonvolatile memory 8 of the redundant circuit. In this case, the control circuit of the redundant circuit outputs the write mode signal, and the switch $Sw_1$ controller 24 outputs the switch $Sw_1$ control signal for transferring the switch $Sw_1$ to its first contact, that is, to the output terminal $O_1$ of the voltage converter 13. At the same time, the switch $Sw_2$ controller 23 outputs the switch $Sw_2$ control signal for transferring the switch $Sw_2$ to its second contact, that is, to the ground 5, and the switch $Sw_3$ controller 22 outputs the switch $Sw_3$ control signal for transferring the switch $Sw_3$ to its second contact, that is, to the output terminal $O_2$ of the voltage converter 13.

Thus, the drain 10 and gate 9 of the nonvolatile memory 8 are supplied with the DC voltages of 7 V and 12 V, respectively, and the source 11 is grounded. In this state, a current flows from the drain 10 to the source 11 of the nonvolatile memory 8, and electrons in a fragment of the current, attracted by the DC voltage of 12 V applied to the gate 9, plunge into the floating gate 12. Thus, the electrons are stored in the floating gate 12, accomplishing the write operation to the nonvolatile memory 8.

While the nonvolatile memory 8 keeps the written state, no current flows from the drain 10 to the source 11 owing to the electrons stored in the floating gate 12 even if the supply voltages are applied to the drain 10 and the gate 9 by connecting the switch $Sw_1$ to the connection point 7, and the switch $Sw_3$ to the power supply terminal 1'. Thus, the potential of the connection point 7 is maintained at the H level, and hence the addressing signal of the H level is output from the latch circuit 4.

Second, in a case where the address data of the L level is to be stored in the circuit portion as shown in FIG. 1 by erasing the nonvolatile memory 8, the control circuit of the redundant circuit outputs the erase mode signal, and the switch $Sw_1$ controller 24 outputs the switch $Sw_1$ control signal for transferring the switch $Sw_1$ to its third contact, that is, to the unconnected contact. At the same time, the switch Sw$_2$ controller 23 outputs the switch Sw$_2$ control signal for transferring the switch Sw$_2$ to its first contact, that is, to the output terminal O$_3$ of the voltage converter 13, and the switch Sw$_3$ controller 22 outputs the switch Sw$_3$ control signal for transferring the switch Sw$_3$ to its third contact, that is, to the ground 5.

Thus, the drain 10 of the nonvolatile memory 8 is placed in a floating state, its gate 9 is grounded, and the source 11 is supplied with the DC voltage of 10 V. In this state, the DC voltage of 10 V is applied across the gate 9 and the source 11 of the nonvolatile memory 8, and the electrons stored in the floating gate 12 are ejected from the floating gate 12 to the source 11. Thus, the electrons are withdrawn from the floating gate 12, accomplishing the erasing operation of the nonvolatile memory 8.

When the switches Sw$_1$ and Sw$_3$ are connected to the supply voltage terminals 1 and 1', respectively, so that the drain 10 and the gate 9 are supplied with the supply voltages, and the switch Sw$_2$ is connected to the ground 5, with the nonvolatile memory 8 keeping the erased state, the nonvolatile memory 8 is in the conduction state. Thus, the potential of the connection point 7 is maintained at the L level because the source 11 is grounded, and hence the addressing signal of the L level is output from the latch circuit 4.

Next, in the case where the address data is not written to nor erased from the nonvolatile memory 8, the control circuit of the redundant circuit do not output the write mode signal nor the erase mode signal. In this state, the switch Sw$_1$ controller 24 outputs the switch Sw$_1$ control signal for transferring the switch Sw$_1$ to its second contact, that is, to the contact connected to the connection point 7. At the same time, the switch Sw$_2$ controller 23 outputs the switch Sw$_2$ control signal for transferring the switch Sw$_2$ to its second contact, that is, to the ground 5, and the switch Sw$_3$ controller 22 outputs the switch Sw$_3$ control signal for transferring the switch Sw$_3$ to its first contact, that is, to the power supply terminal 1'.

Thus, the drain 10 and the gate 9 of the nonvolatile memory 8 are connected to the connection point 7 and power supply terminal 1', respectively. In this state, the nonvolatile memory 8 sets the connection point 7 to the open state or the grounded state depending on whether the floating gate 12 stores electrons or not. Therefore, the address data of the H level or L level is output from the latch circuit 4 in accordance with the written state of the nonvolatile memory 8.

When the power is turned on in this state and supplied to the redundant circuit of the embodiment 1, the power supply terminals 1 and 1' are supplied with the supply voltages, and a start signal is applied to the timer 21. Thus, the supply voltages are applied to the drain and gate of the nonvolatile memory 8 so that the address data having been written in the nonvolatile memory 8 is latched by the latch circuit 4, and the timer 21 begins its time count operation. When the predetermined time has elapsed after the power on, and the output of the latch circuit 4 stabilizes, the output signal of the timer 21 falls to the L level, and the timer 21 outputs it as a switching command signal. Receiving the switching command signal, the switch Sw$_3$ controller 22 outputs the switch Sw$_3$ control signal instructing the switch Sw$_3$ to transfer to the third contact, that is, to the ground 5. This is different from the conventional apparatus in which the gate 9 is continuously fed with the power supply voltage throughout the power on to the power off. According to the embodiment 1, since the gate 9 is grounded as shown in FIG. 1 when the output of the latch circuit 4 stabilizes, the probability can be reduced that unnecessary electrons are injected to the floating gate 12 of the nonvolatile memory 8.

As described above, according to the present embodiment 1, an advantage can be gained of reducing the possibility that the unnecessary electrons are injected to the floating gate 12, and hence of substantially decreasing the possibility of bringing about the problem 1.

EMBODIMENT 2

Figure 3:
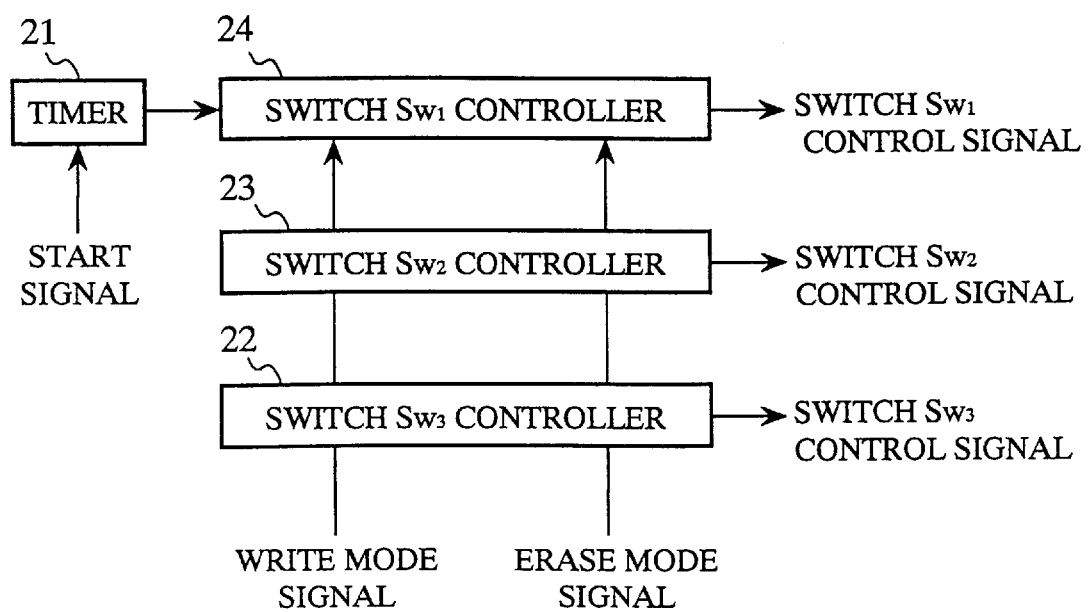
FIG. 3 is a block diagram showing a switch control circuit of an embodiment 2 of the redundant circuit in accordance with the present invention.

FIG. 3 is a block diagram showing a configuration of a switch control circuit for generating the switch control signals in an embodiment 2 of a redundant circuit in accordance with the present invention. The addressing circuit of the present embodiment 2 is the same as that of the embodiment 1 as shown in FIG. 1, and hence the illustration and description thereof is omitted here.

The individual components of the switch control circuit of FIG. 3 are the same as those of the switch control circuit of the embodiment 1 as shown in FIG. 2. However, the switch control circuit of FIG. 3 differs from that of FIG. 2 in that the switching command signal the timer 21 outputs after the predetermined time has elapsed is supplied to the switch Sw$_1$ controller 24 (second breaker means).

Next, the operation will be described.

The method of writing and erasing of the address data of the nonvolatile memory 8 is the same as that of the embodiment 1.

When the redundant circuit is powered up to read thus stored address data from the nonvolatile memory 8, the timer 21 starts counting time as in the embodiment 1. When the predetermined time has elapsed after the power up and the latch circuit 4 stabilizes, the output signal of the timer 21 falls to the L level, and the switching command signal is output to the switch Sw$_1$ controller 24 Receiving the switching command signal, the switch Sw$_1$ controller 24 produces the switch Sw$_1$ control signal for transferring the switch Sw$_1$ to the third unconnected contact. Thus, the drain 10 is set in a floating state at the point when the output of the latch circuit 4 stabilizes in the embodiment 2. This differs from the conventional counterpart, in which the drain 10 is continuously supplied with a voltage of the supply voltage level throughout the power on to the power off. This makes it possible to reduce the possibility that the electrons stored in the floating gate 12 of the nonvolatile memory 8 are discharged.

As described above, the embodiment 2 has an advantage that the possibility of bringing about the problem 2 can be substantially reduced because the possibility is reduced of emitting the electrons from the floating gate 12.

EMBODIMENT 3

Figure 5:
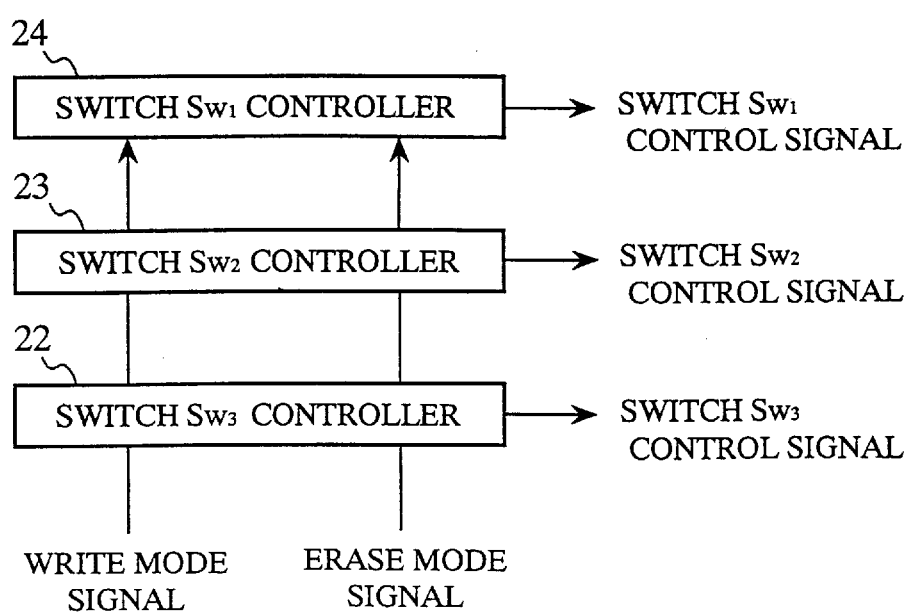
FIG. 5 is a block diagram showing a switch control circuit of the embodiment 3 of the redundant circuit in accordance with the present invention.
Figure 4:
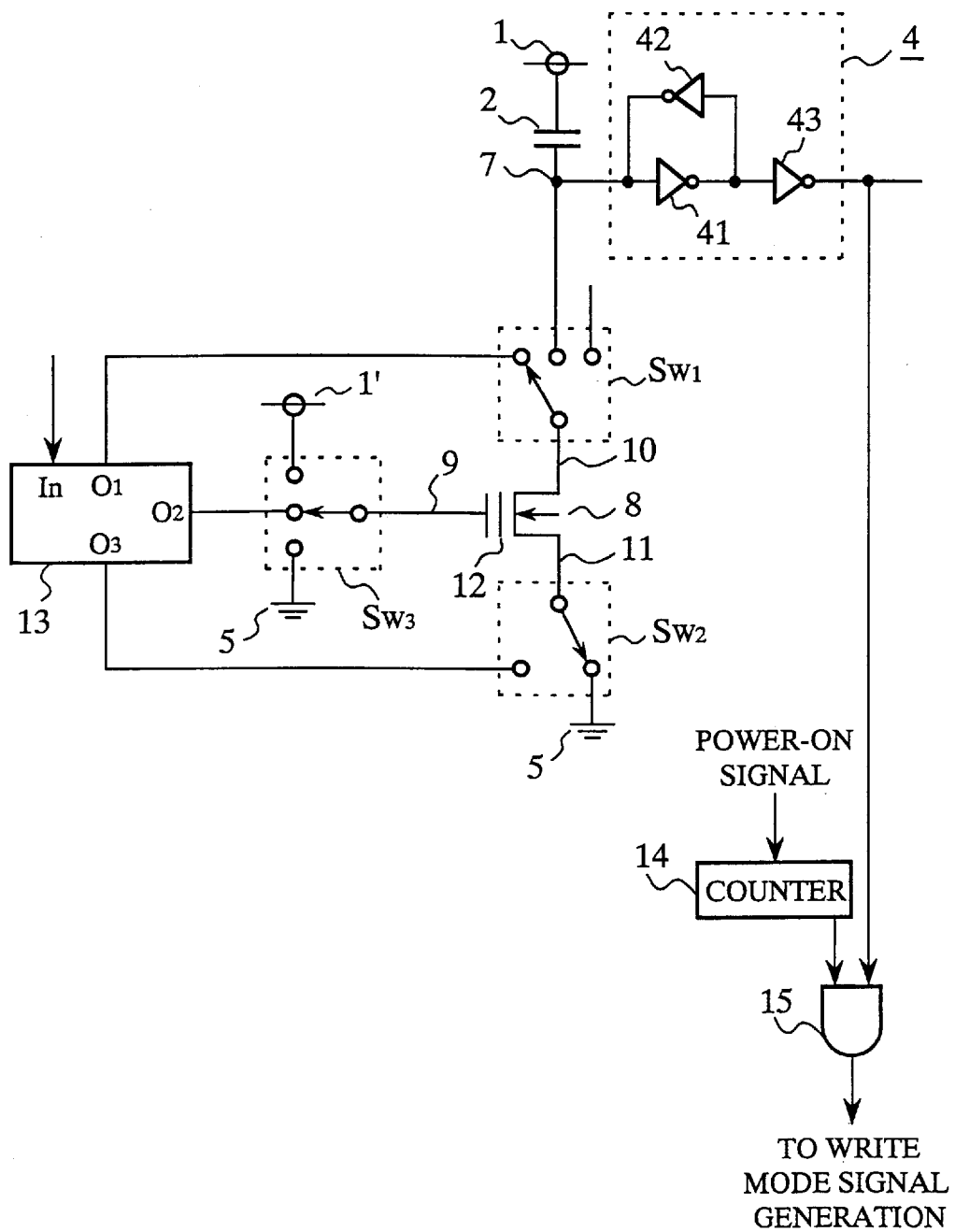
FIG. 4 is a circuit diagram showing part of the addressing circuit of an embodiment 3 of the redundant circuit in accordance with the present invention.

FIG. 4 is a circuit diagram showing part of the addressing circuit of an embodiment 3 of the redundant circuit in accordance with the present invention, in which a circuit portion corresponding to only one bit of the addressing circuit is shown. The addressing circuit comprises a plurality of circuit portions as shown in FIG. 4 corresponding to the number of bits in a memory address in which the redundant circuit is mounted. FIG. 5 is a block diagram showing a configuration of the switch control circuit of the embodiment 3. In FIGS. 4 and 5, the same components as those of the addressing circuit of FIG. 1 and S the switch control circuit of FIG. 2 are designated by the same reference numerals, and the description thereof is omitted here.

In FIG. 4, the reference numeral 14 designates a counter (counting means) for counting a power-on signal, and thus counting the number of power-on operations of the redundant circuit; 15 designates an AND gate (write command signal output means) having its first input terminal connected to the output terminal of a predetermined bit of the counter 14, its second input terminal connected to the output terminal of the latch circuit 4, and its output terminal produce a write mode signal generating signal. The counter 14 includes a nonvolatile memory so that it can hold the counted value after the power of the information circuit is turn off. The switch control circuit of FIG. 5 has the same configuration as that of FIG. 2 except that the timer 21 is removed in FIG. 5.

Next, the operation will be described.

The method of writing or erasing the address data to or from the nonvolatile memory 8 is the same as that of the embodiment 1. In addition, the method of reading the address data thus stored in the nonvolatile memory 8 is the same as that of the embodiment 1.

In the present embodiment 3, the counter 14 counts the power-on signal indicating the switch-on each time the redundant circuit is turned on. When the counted number of the counter 14 reaches a predetermined number, the output bit of the counter 14 connected to the first input terminal of the AND gate 15 rises to the H level. On the other hand, if the bit of the nonvolatile memory 8 has already been written, the output of the latch circuit 4 is placed at the H level. Thus, the output terminal of the AND gate 15 becomes the H level so that the write mode signal generating signal is produced which commands the rewrite of the nonvolatile memory 8. This makes it possible to recharge the floating gate 12 with electrons within a time range while the written state of the nonvolatile memory 8 can be still recognized because of a small degree of natural discharge, in that time range, of the electrons held in the floating gate 12 of the nonvolatile memory 8, even if they are gradually discharged with time owing to some process defects.

As described above, according to the present embodiment 3, the written state of the floating gate 12 of the nonvolatile memory 8 can be nearly regularly refreshed. This has an advantage of preventing the problem 3.

EMBODIMENT 4

Figure 6:
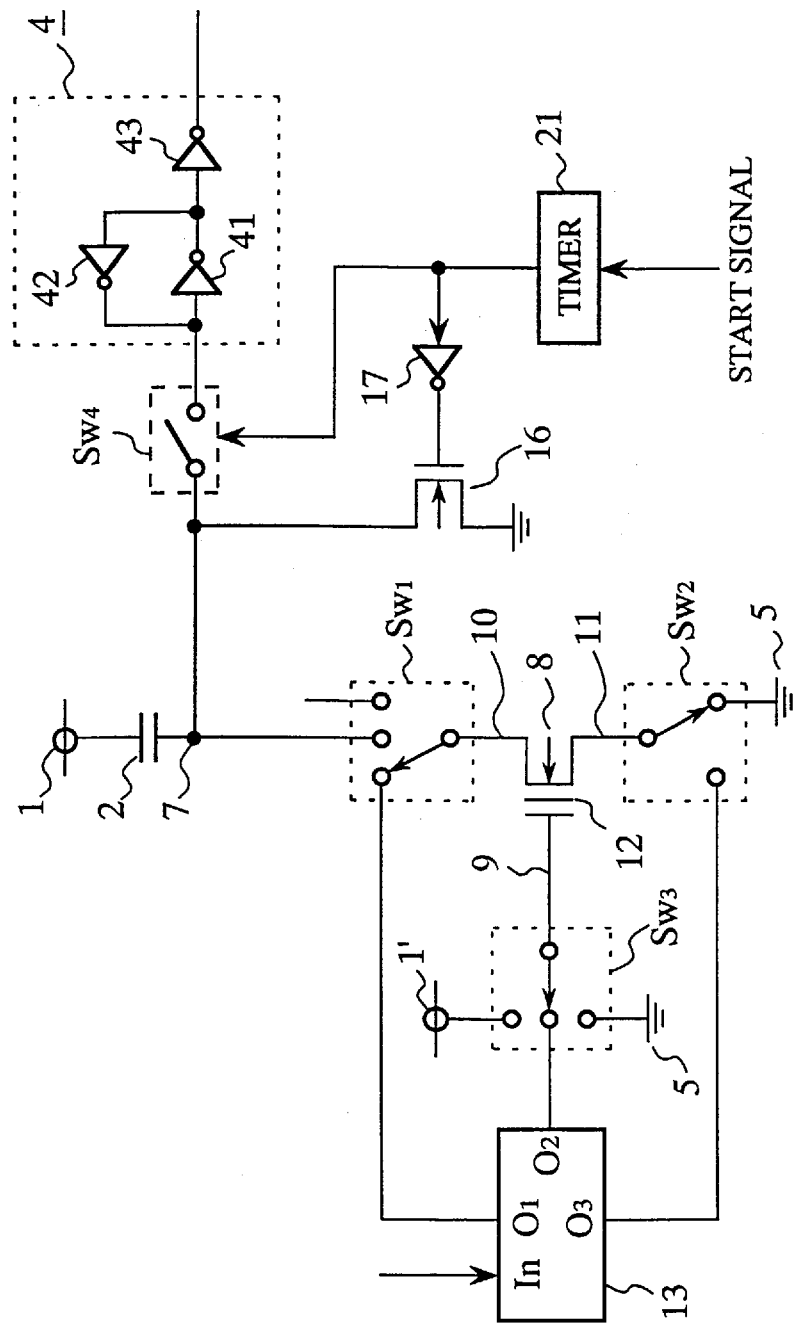
FIG. 6 is a circuit diagram showing part of the addressing circuit of an embodiment 4 of the redundant circuit in accordance with the present invention.

FIG. 6 is a circuit diagram showing part of the addressing circuit of an embodiment 4 of the redundant circuit in accordance with the present invention, in which a circuit portion corresponding to only one bit of the addressing circuit is shown. The addressing circuit comprises a plurality circuit portions as shown in FIG. 6 corresponding to the number of bits in a memory address of the memory in which the redundant circuit is mounted. In FIG. 4, the same components as those of the addressing circuit of FIG. 1 are designated by the same reference numerals, and the description thereof is omitted here. The switch control circuit of the present embodiment 4 is the same as that of the embodiment 3 as shown in FIG. 5.

In FIG. 6 the reference numeral 16 designates an N-channel transistor having its drain connected to the connection point 7, and its source grounded; 17 designates an inverter having its input terminal connected to the output terminal of the timer 21, and its output terminal connected to the gate of the transistor 16; and $Sw_4$ designates a switch (breaker means) interposed between the connection point 7 and the latch circuit 4 (holding means), with its on/off control signal fed from the output of the timer 21.

Next, the operation will be described.

The method of writing or erasing the address data to or from the nonvolatile memory 8 is the same as that of the embodiment 1. In addition, the method of reading the address data thus stored in the nonvolatile memory 8 is the same as that of the embodiment 1.

When the power of the redundant circuit is turned on in the present embodiment 4, the power supply terminals 1 and 1' are fed with the supply voltages, and a start signal is applied to the timer 21, by which the timer 21 begins its time count operation, and the H level output signal is supplied to the input terminal of the inverter 17 and the switch $Sw_4$. This turns off the N-channel transistor 16 and turns on the switch $Sw_4$. When the predetermined time, during which the output of the latch circuit 4 stabilizes, has elapsed after the power on, the output signal of the timer 21 falls to the L level. Receiving this switching command signal, the transistor 16 turns on and the switch $Sw_4$ turns off. Thus, the output level of the latch circuit 4 is held unchanged, and the connection point 7 is grounded through the transistor 16. This can prevent the drain 10 of the nonvolatile memory 8 from being supplied with the potential of the supply voltage level, and substantially reduce the probability that the electrons stored in the floating gate 12 are emitted therefrom.

As described above, according to the present embodiment 4, an advantage can be gained of substantially reducing the possibility that the electrons are emitted from the floating gate 12 of the nonvolatile memory 8 in the written state, and hence of preventing the problem 2.

Figure 7:
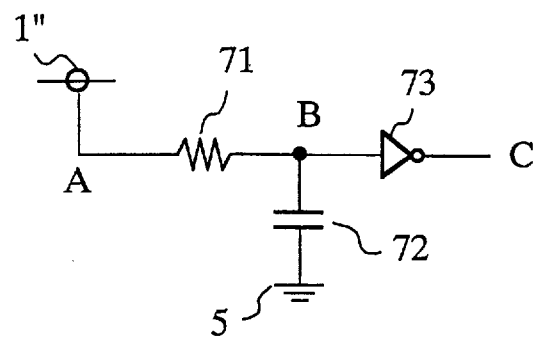
FIG. 7 is a circuit diagram showing a timer means using a CR delay circuit, which is employed by the embodiments 1, 2 and 4.

Although the foregoing embodiments employ the timer 21 as the time counting means to transfer the switches after the predetermined time has elapsed, the time counting means of the present invention is not limited to the timer 21. For example, a CR delay circuit as shown in FIG. 7 can be used. In FIG. 7, the reference numeral 1" designates a power supply terminal, 71 designates a resistor, 72 designates a capacitor and 73 designates an inverter.

Next, the operation will be described with reference to the timing chart of FIG. 8.

Figure 8:
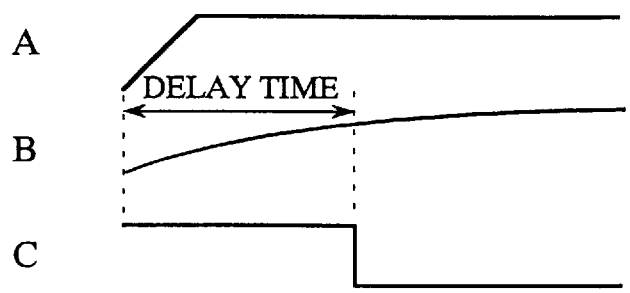
FIG. 8 is a timing chart illustrating the operation of the timer means as shown in FIG. 7.

In FIG. 8, the symbol A designates a voltage waveform at the connection point of the power supply terminal 1" and resistor 71; B designates a voltage waveform at the connection point of the resistor 71 and capacitor 72; and C designates a voltage waveform of the output terminal of the inverter 73.

When the redundant circuit is turned on and the voltage waveform A rises, the capacitor 72 is gradually charged at the time constant determined by the resistance of the resistor 71 and the capacitance of the capacitor 72, and thus the voltage waveform B gradually rises. Although the output signal of the inverter 73 assumes the H level at first, it falls to the L level when the voltage of the voltage waveform B reaches the threshold voltage of the inverter 73. Thus, the voltage waveform C can be utilized as the switching command signal by setting the delay time until the rise of the voltage waveform C longer than the stabilization time of the output of the latch circuit 4. Incidentally, in FIG. 8, the horizontal axis is a time axis and the vertical axis is a voltage axis.

Figure 9:
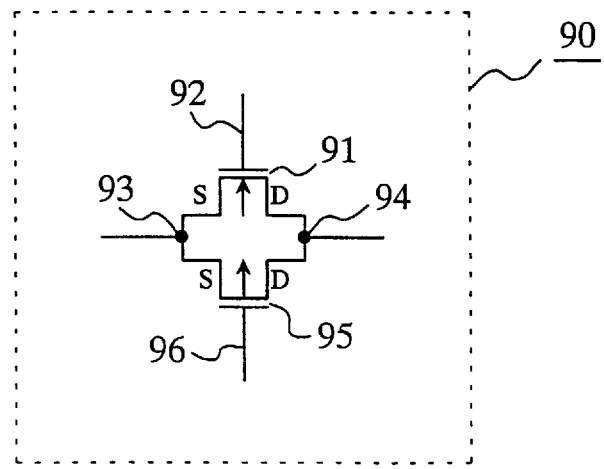
FIG. 9 is a circuit diagram showing a transmission gate used by the embodiments 1–4.
Figure 10:
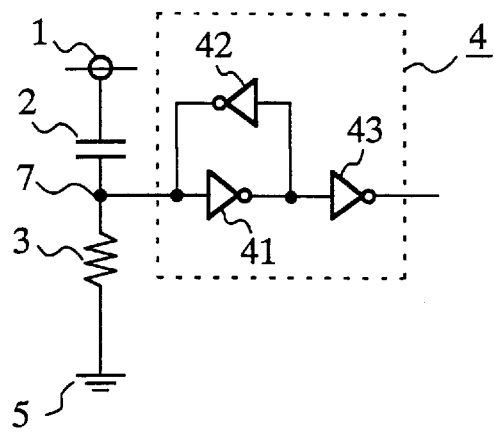
FIG. 10 is a circuit diagram showing part of the addressing circuit of a conventional redundant circuit.
Figure 11:
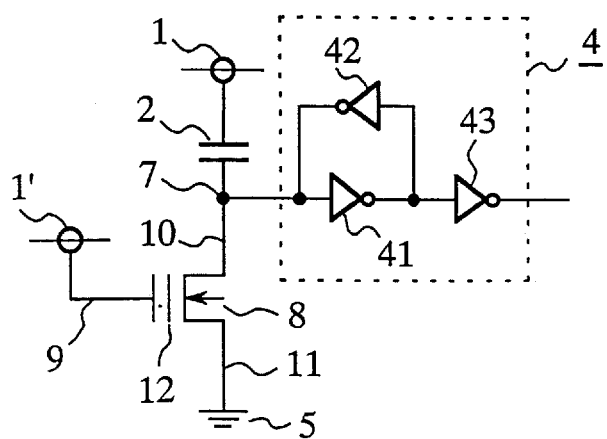
FIG. 11 is a circuit diagram showing part of the addressing circuit of another conventional redundant circuit.

Although the foregoing embodiments employ MOS transistors as the switches, a transmission gate 90 as shown in FIG. 9 can also be used as a switch. In FIG. 9, the reference numeral 91 designates an N-channel transistor with its gate 92, source 93 and drain 94; and 95 designates a P-channel transistor with its gate 96, source 93 and drain 94.

Next, the operation will be described.

When turning on the transmission gate 90, an H level signal is applied to the gate 92 of the N-channel transistor 91 and an L level signal is applied to the gate 96 of the P-channel transistor 95, thereby establishing conduction across the sources 93 and drains 94. On the other hand, when turning off the transmission gate 90, the L level signal is applied to the gate 92 of the N-channel transistor 91 and the H level signal is applied to the gate 96 of the P-channel transistor 95, thereby breaking the conduction across the sources 93 and drains 94.

Using the transmission gate 90 as the switches in this way makes it possible to eliminate the variations in the threshold voltage of the MOS transistor during the switching operation. Thus, the transmission gates can reduce the loss of the supply voltage, and are preferably applied to a low-voltage drive.

What is claimed is:

1. A redundant circuit comprising:

a plurality of redundant memory cells;

an addressing circuit for generating an address signal corresponding to an address of said redundant memory cells, the address signal including a plurality of bits;

a plurality of non-volatile memory cells, each of said non-volatile memory cells corresponding to one of the bits of the address signal, each of said non-volatile memory cells having a gate, a drain, and a source, wherein the address signal is generated in response to writing of data to said non-volatile memory cells;

timer means for counting a time period from power-on of said redundant circuit, and for outputting a timing signal when a first time period has been counted; and breaker means for interrupting application of a supply voltage to at least one of the gate and the drain of a first memory cell of said non-volatile memory cells in response to the timing signal.

2. The redundant circuit as claimed in claim 1, comprising holding means for maintaining a voltage level of the drain of said first nonvolatile memory cell.

3. The redundant circuit as claimed in claim 2, wherein the first time period is set longer than a time during which said holding means stabilizes its output voltage, and said breaker means disconnects a supply voltage from the gate of said first non-volatile memory cell and connects the gate of the first non-volatile memory cell to ground in response to the timing signal.

4. The redundant circuit as claimed in claim 2, wherein the first time period is longer than a time during which said holding means stabilizes its output voltage, and said breaker means disconnects the drain of said first non-volatile memory cell from a supply voltage and places the drain of said first non-volatile memory cell in a floating state in response to the timing signal.

5. The redundant circuit as claimed in claim 2, wherein the first time period is longer than a time during which said holding means stabilizes its output voltage, and wherein said breaker means comprises:

grounding means for grounding the drain of said first non-volatile memory cell in response to the timing signal, and disconnecting means for disconnecting said holding means from the drain of the first non-volatile memory cell in response to the timing signal.

6. The redundant circuit as claimed in claim 3, wherein said timer means comprises a timer.

7. The redundant circuit as claimed in claim 3, wherein said timer means comprises a resistor-capacitor delay circuit.

8. The redundant circuit as claimed in claim 3, wherein said breaker means comprises a plurality of MOSFETs.

9. The redundant circuit as claimed in claim 3, wherein said breaker means comprises a plurality of transmission gates.

10. The redundant circuit as claimed in claim 4, wherein said timer means comprises a timer.

11. The redundant circuit as claimed in claim 4, wherein said timer means comprises a resistor-capacitor delay circuit.

12. The redundant circuit as claimed in claim 4, wherein said breaker means comprises a plurality of MOSFETs.

13. The redundant circuit as claimed in claim 4, wherein said breaker means comprises a plurality of transmission gates.

14. The redundant circuit as claimed in claim 5, wherein said timer means comprises a timer.

15. The redundant circuit as claimed in claim 5, wherein said timer means comprises a resistor-capacitor delay circuit.

16. The redundant circuit as claimed in claim 5, wherein each of said grounding means and said disconnecting means comprises a MOSFET.

17. The redundant circuit as claimed in claim 5, wherein each of said grounding means and said disconnecting means comprises a a transmission gate.

18. A redundant circuit comprising:

a plurality of redundant memory cells;

an addressing circuit for generating an address signal corresponding to an address of said redundant memory cells, the address signal including a plurality of bits;

a plurality of non-volatile memory cells, each of said non-volatile memory cells corresponding to one of the bits of the address signal, each of the non-volatile memory cells having a gate, a drain, and a source, wherein the address signal is generated in response to writing of data to said non-volatile memory cells;

counting means for counting power-on operations of said redundant circuit, and for outputting a counted signal when a first number of occurrences of power-on operations is counted; and write command signal output means for outputting a signal commanding writing into said first non-volatile memory cell in response to the counted signal.

19. The redundant circuit as claimed in claim 18, further comprising holding means for maintaining a voltage level of the drain of said first non-volatile memory, wherein the first number of occurrences of power-on operations corresponds to a time period during which said holding means can recognize a write state of said non-volatile memory.

\* \* \* \* \*